United States Patent

Sass

4,088,990

May 9, 1978

[54] TIME OF DAY, TIME AND DATE AND EVENT NUMBER GENERATOR FOR RECORDATION OF PHYSIOLOGICAL EVENTS

[76] Inventor: Donald J. Sass, 9416 Worth Ave., Silver Spring, Md. 20901

[21] Appl. No.: 665,581

[22] Filed: Mar. 10, 1976

[51] Int. Cl.² .............................................. G06F 3/14
[52] U.S. Cl. ................................ 340/324 R; 178/15; 340/183; 340/336; 346/60; 346/110 R
[58] Field of Search ........... 340/324 A, 324 AD, 180, 340/183, 336, 359, 324 R; 178/30, 15; 128/2.06 R, 2.05 A, 2.1 A; 346/110 R, 60, 66, 94

[56] References Cited

U.S. PATENT DOCUMENTS

| 3,371,349 | 2/1968 | Schinner et al. | 346/60 |
| 3,646,606 | 2/1972 | Buxton et al. | 128/2.06 R |
| 3,714,663 | 1/1973 | Smith | 346/110 R |

*Primary Examiner*—Marshall M. Curtis
*Attorney, Agent, or Firm*—R. Sciascia; R. Beers; S. Sheinbein

[57] ABSTRACT

A code generator generates, upon command, code sequences representing either time of day, time and date, or event number codes, in either single sequences or continuously repeating code sequences for simultaneous recordation with a physiological event on magnetic tape or oscillographic paper for permanently identifying and indexing biomedical data. Multiplexed binary coded decimal output lines of a digital clock are strobed to provide the option of either single frame or continuous frame operation while requiring no critical timing circuits, and the sequencing operations are synchronized by the multiplex timer, which recordation is visually interpretable.

12 Claims, 20 Drawing Figures

MULTIPLEX
TIMER 12

START 100

SET MV 104

Q, MV 104

MI

MIO

HI

HIO

SI

SIO

Q, MV 112

$\overline{Q}$, MV 114

NAND GATE 204

SHIFT REGISTER 86

COUNTER 254

NAND GATE 252

DISPLAY 30
OP AMP 250

TIME OF DAY, TIME AND DATE AND EVENT NUMBER GENERATOR FOR RECORDATION OF PHYSIOLOGICAL EVENTS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to time code generators and more specifically to time code generators which will generate serial code sequences for use in biomedical or other data acquisition systems.

Paper recorders and magnetic tape recorders are commonly used to record data in biomedical laboratories and hospitals. It is often necessary to annotate the data with identifying comments such as date of the test, time of the recording, or the event which is being recorded. Paper recordings are commonly annotated by comments written by hand on the recordings as they are generated, or added later from memory. Magnetic tape recordings are annotated with verbal comments if a voice track is available.

Some paper and magnetic tape recorders have an event marker that is an integral part of the instrument. Significant events are indicated on their recordings by manually introduced single or multiple spikes or blips. Event marks, as commonly used, carry limited information. Electronic date and time code generators have been developed to synchronize magnetic tape recorders used in data links in aerospace and other applications. Time code instruments are also used in automatic tape search and data retrieval applications.

Many time code generators are available with a slow-code or oscillographic code output in one or more of at least 50 recognized serial BCD formats. However, the present date and time code generators and the formats which they employ have limitations which are particularly apparent when the instrument is employed in biomedical data acquisition.

Present instruments only generate time codes in a continuously repeating mode of operation and cannot generate a single complete code sequence upon command. The capability of generating either a single frame and/or repeating frames is an important option for a time, date, and event code generator intended for use in a biomedical laboratory. In such an environment, paper and magnetic tape recorders are frequently started and stopped at irregular intervals, and experimental variables and conditions are often changed between recording intervals according to a predetermined protocol. It is important for subsequent data analysis to record the time of day simultaneously in all media each time records are taken, and to index important events with a unique numerical code. Usually one cannot afford to use a data channel to record only indexing codes. The option of brief, single code frames permits one to interlace the indexing codes with physiologic or other data on the same channel. For example, the date might be introduced at the start of the tape or paper recording to identifying the patient, animal, or the experiment. If many brief records are taken at random intervals, e.g. during cardiac catheterization, the time of day might well be recorded at the start of each brief record. If continuous recordings are taken over many hours, for example if a patient undergoing open heart surgery, the time of day would probably be recorded at periodic intervals, perhaps every ten minutes. In addition to periodic time and date recordings, consecutive event numbers might be recorded to index specific events such as the withdrawal of a blood sample, the injection of a drug, measurement of cardiac output, the point at which the patient or experimental animal is switched to extracorporeal blood oxygenation, and the like. The presence of date, time, and consecutive event codes recorded simultaneously in all media facilitates matching of recorded data with the written protocol records, snychronizing events recorded simultaneously by different recording instruments.

Since the standard codes currently used are intended to be used in a continuously repeating mode and to be read by a special time code reading instrument, the code format is not optimized for visual interpretation. The individual groups of data bits are not readily identified, and the individual data bits are often identified manually by counting with reference to special start-frame identification bits included in the code. None of present commerical instruments include a consecutive event number generator that employs the same BCD serial format at the time code portion of the same instrument.

SUMMARY OF THE INVENTION

Accordingly, the present invention provides a time, date, and event code generator which will generate upon command coded sequences representing either time of day, time and date, or event number in either single sequence or continuously repeating code sequence, for simultaneous recordation with physiological data.

A unique method is utilized to strobe the multiplexed binary coded decimal (BCD) output lines of a digital clock to provide the option of either single frame or continuous frame operation that requires no critical timing circuits, and the sequencing operations are synchronized by the multiplex timer. Logic circuitry is configured to provide the codes which are thereupon recorded on paper tape or magnetic tape in a BCD format in which a one bit is a positive voltage level, a zero bit is a minus voltage level, and each bit is separated from adjacent bits by short spaces that are at zero voltage.

OBJECTS OF THE INVENTION

It is therefore an object of the present invention to provide a device to permanently identify and index physiologic or other data simultaneously with the recording of the data.

Yet another object of the present invention is to provide a device that will generate time, date, and event codes in either a single sequence or continuously repeating sequences upon command.

A further object of the present invention is to provide for a time, day, and event code generator with a binary coded decimal format which may be easily and quickly interpreted by visual inspection.

A still further object of the present invention is to provide a time, day and event code generator with a code format which may be easily adapted to operate with external code reading instruments.

Still another object of the present invention is to provide a code generator which will generate a code representing either time of day, time and date, and/or event number upon command.

Yet a still further object of the present invention is to provide a generator that uses the same BCD format for event number as the time code portion of the same instrument.

BRIEF DESCRIPTION OF THE INVENTION

These and other objects, features and advantages of the present invention will become apparent to those skilled in the art as the disclosure made in the following description of a preferred embodiment of the invention as illustrated in the accompanying drawings in which:

FIG. 1 is a block diagram illustrating the code generator according to this invention;

FIGS. 2(a) through 2(l) are timing waveforms of various signals in the logic diagram of FIG. 1;

FIGS. 3(a) through 3(e) are timing waveforms appearing at the outputs of the code generator;

FIG. 4 is a block diagram of the function switch and mode selection circuitry; and FIG. 5 is a block diagram of the date and event counters.

DESCRIPTION OF THE PREFERRED EMBODIMENT

Figure 1:
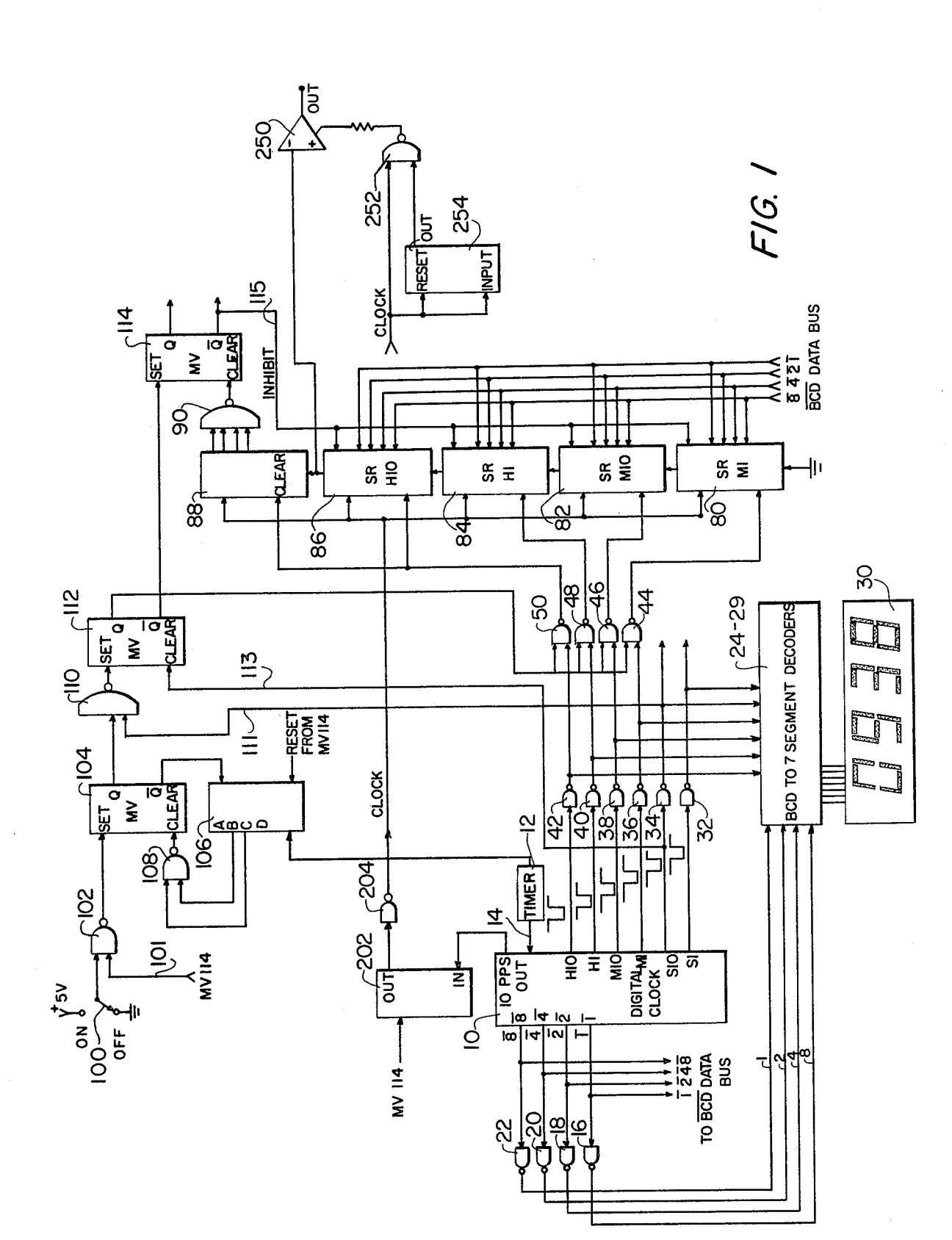
Figure 2A:

Referring now to the drawings wherein like reference characters designate identical or corresponding parts throughout the several views, and more particularly to FIG. 1 thereof, there is shown an integrated circuit digital clock 10 having four parallel binary coded decimal (BCD) data outputs $\overline{1}, \overline{2}, \overline{4}, \overline{8}$. A National Semiconductor type MM 5313 digital clock may be utilized as clock 10, although any other integrated circuit digital clock that has multiplexed BCD outputs may be employed. Six four bit time digits (representing hours, minutes, and seconds) appear on these four lines sequentially at a rate that is set by a conventional multiplex timer 12 output on line 14. Multiplex timer 12 may comprise a unijunction transistor relaxation oscillator that free runs at a nominal frequency of 1 KHz, FIG. 2(a) although the frequency is not critical.

Data on the BCD output lines $\overline{1}, \overline{2}, \overline{4}, \overline{8}$ at any one instant are identified by a logic low on the corresponding digit enable output lines S1, S10, M1, M10, H1, H10, from clock 10, respectively (S representing seconds, M, minutes, and H, hours). FIGS. 2(d) through 2(j) illustrate their relationship. The BCD data $\overline{1}, \overline{2}, \overline{4}, \overline{8}$ is complemented to true BCD data, 1, 2, 4, 8 by inverters 16, 18, 20, 22, respectively, which BCD data is coupled to six conventional decoders 24 through 29 (which may be SN 8880 type) which convert the BCD data to seven segment data to drive a gas discharge display 30, each decoder coupled to its respective digit (only four digits shown for simplicity).

The digit enable signals S1, S10, M1, M10, H1, H10 are inverted by inverters 32, 34, 36, 38, 40, 42, respectively, to provide $\overline{S1}, \overline{S10}, \overline{M1}, \overline{M10}, \overline{H1}, \overline{H10}$, and each in turn unblanks its appropriate corresponding SN 8880 decoder 24 through 29 during the interval that data for the associated digit is to be displayed. Thus, six-digit time is continuously displayed on visual display 30, whether or not a code sequence is being recorded in the manner to be discussed hereinafter. $\overline{S1}, \overline{S10}, \overline{M1}, \overline{M10}, \overline{H1}$ and $\overline{H10}$ are further provided as one of the two inputs to respective NAND gates with only gates 44, 46, 48 and 50, for the minutes and hours illustrated for simplicity.

Figure 2B:
Figure 2C:
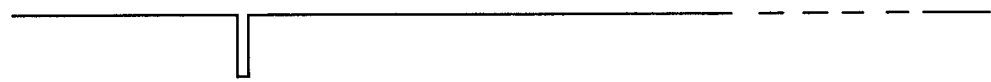
Figure 2D:
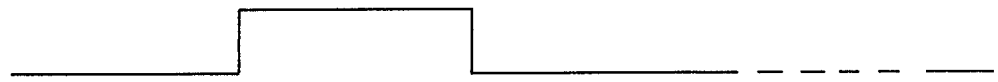
Figure 2E:
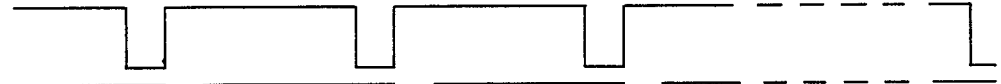
Figure 2F:
Figure 2G:
Figure 2H:
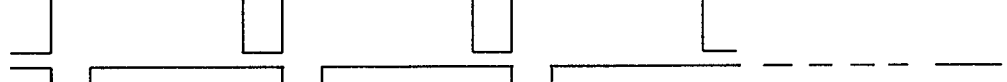
Figure 2I:
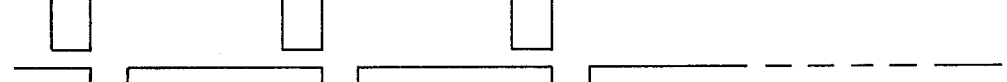
Figure 2J:

To record a single four digit time code frame on the recording medium, a start switch 100 is momentarily depressed, connecting one input of NAND gate 102 to a logic high (+5 volts). The output of NAND gate 102 goes logic low for reasons to be discussed hereinafter, setting multivibrator 104 coupled thereto. Multivibrator 104, an SN 7470 type, thereupon provides a logical high Q output, and a logical low $\overline{Q}$ output, which low output enables decade counter 106 coupled thereto. FIGS. 2(b) through 2(d) illustrate the relationship of these timing waveforms. Decade counter 106, which may be an SN 7490 type, is clocked by multiplex timer 12 and provides four outputs A, B, C, D. The following table represents the respective outputs A, B, C, D for counts 0-6:

| Count | A | B | C | D |
|---|---|---|---|---|
| 0 | 0 | 0 | 0 | 0 |
| 1 | 1 | 0 | 0 | 0 |
| 2 | 0 | 1 | 0 | 0 |
| 3 | 1 | 1 | 0 | 0 |
| 4 | 0 | 0 | 1 | 0 |
| 5 | 1 | 0 | 1 | 0 |
| 6 | 0 | 1 | 1 | 0 |

Figure 2K:

By coupling the outputs B and C to NAND gate 108, which output is provided to the clear input of multivibrator 104, multivibrator 104 is cleared on the sixth multiplexed pulse when both outputs B and C are high, resetting multivibrator 104 Q output low and $\overline{Q}$ output high, thereby disabling and resetting decade counter 106 to zero. Thus, the Q output of multivibrator 104 is high for exactly six multiplex counts, insuring that NAND gate 110 coupled thereto, receives a logic high therefrom during this time interval. Inverted digit enable signal $\overline{S10}$ on line 111 is provided as the second input to NAND gate 110, insuring that exactly one $\overline{S10}$ signal will be gated by NAND gate 110 to set multivibrator 112 coupled thereto. Multivibrator 112 is cleared on the next digit enable S10 pulse on line 113 exactly six multiplex counts later. FIG. 2(k) illustrates the Q output of multivibrator 112. The Q output of multivibrator 112 is applied to NAND gates 44, 46, 48, 50 (none shown for $\overline{S1}$ and $\overline{S10}$ for simplicity), to gate exactly one complete sequence of the six digit enable pulses $\overline{S1}, \overline{S10}, \overline{M1}, \overline{M10}, \overline{H1}, \overline{H10}$ provided at the outputs of NAND gates 32, 34 36, 38, 40, 42 respectively.

Figure 2L:
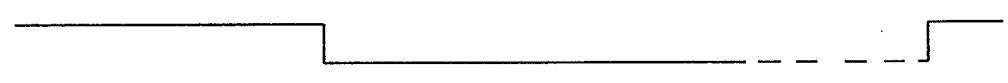

Each digit enable pulse gated through its respective NAND gate 44, 46, 48, and 50 loads one of the six 8-bit parallel load, serial out shift registers 80, 82, 84, and 86, (an additional two shift registers would be provided for $\overline{S1}$ and $\overline{S10}$) respectively, with four bits of $\overline{BCD}$ data from clock 10 corresponding to that digit. In other words, the $\overline{H10}$ digit-enable pulse loads register 86 with four binary bits $\overline{1}, \overline{2}, \overline{4}, \overline{8}$ ($\overline{BCD}$) corresponding to tens of hours, then the H1 digit-enable pulse loads register 84 with unit hours expressed in $\overline{BCD}$ data bits, and so forth. (1's) are loaded into the remaining four bits of each register 80 through 86, which registers may be of the SN 74165 type. When multivibrator 112 was set by inverted digit enable signal $\overline{S10}$, its $\overline{Q}$ output set SN 7470 type multivibrator 114 coupled thereto. The logical low $\overline{Q}$ output of multivibrator 114, FIGS. 2(l), is provided to SN 7490 type decade counter 202, whose output, after being inverted by inverter 204, provides the clock input to shift registers 80 through 86. The logical low $\overline{Q}$ is also provided as the second input to NAND gate 102 on line 101 preventing switch debouncing therein, as well as false triggering during the code sequence. Decade counter 202 is arranged to give switch selected outputs at 1/10, 1/5 or ½ of the 10 pulse per second output of digital clock 10 coupled thereto, providing either 1, 2 or 5 pulse per second outputs, respectively. These output pulses clock the data serially out of shift registers 80 through 86, respectively, in a direction of H10 out first and S1 out last. Serial zeros are clocked into the S1 register behind the $\overline{BCD}$ and (1's) that were previously parallel loaded into the registers. When all of the data has been shifted out, the next four 1's that are shifted into serial - in, parallel load shift register 88, an SN 74195 type, coupled to shift register 86, cause NAND gate 90 coupled thereto to reset multivibrator 114. Upon resetting of multivibrator 114, its outputs disable the clock input to shift registers 80 - 86 on line 115, decade counter 202 is reset to zero, decade counter 106 is enabled and ready to count when the next start code command is given at switch 110, and NAND gate 102 is provided with a logical high at input line 101.

Figure 3A:
Figure 3B:
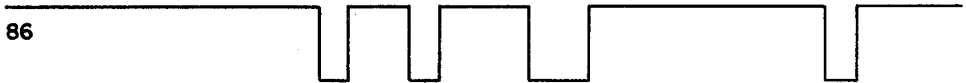
Figure 3C:
Figure 3D:
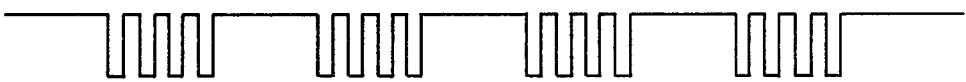
Figure 3E:

The 36 bit serial code shifted out of shift registers 86 (only H10, H1, M10 and M1 shown for simplicity on display 30) appear as a sequence of ones and zeros as illustrated in the trace of FIG. 3(b). FIG. 3(a) illustrates their relationship with respect to clock pulses from NAND gate 204. In this format, data zeros cannot be readily distinguishable from spaces and the trace would be difficult to interpret visually. The output circuit to be described hereinafter separates data zeros from spaces by converting the data zeros to negative pulses and retains the spaces at zero volts. Operational amplifier 250 is strobed in synchronism with the $\overline{BCD}$ data by decade counter 202 clock input at NAND gate 252 coupled thereto. The most significant bit output of three bit binary counter 254, an SN 7493 type, also coupled to receive the clock signal on its input terminal and the clock inhibit signal from multivibrator 114 output on its reset input, provides the second input to NAND gate 252. The most significant bit output of counter 254 is illustrated in FIG. 3(c) to provide a logical high for four clock pulses. NAND gate 252 accordingly generates the train of strobe pulses to operational amplifier 250, whose output pulses are illustrated in FIG. 3(d). Operational amplifier 250 output signal, representing the hours and minutes for recordation is illustrated in FIG. 3(e). Data ones remain positive voltage pulses, and the individual data zero and one bits are separated by short spaces that are at zero volts. Hence the serial code in its final output at operational amplifier output 250 and display 30 appears as readily visually interpretable data.

Figure 4:
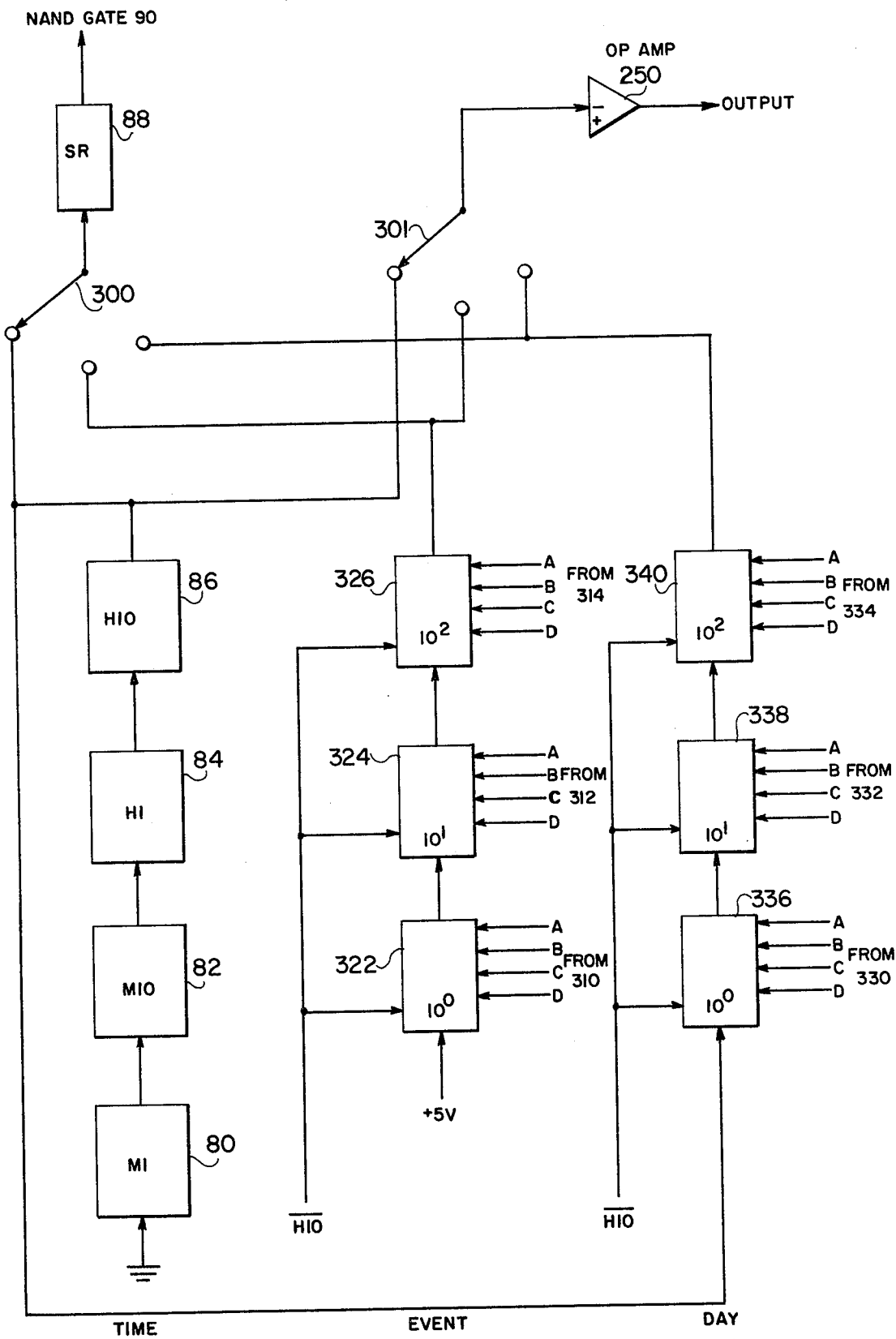
Figure 5:
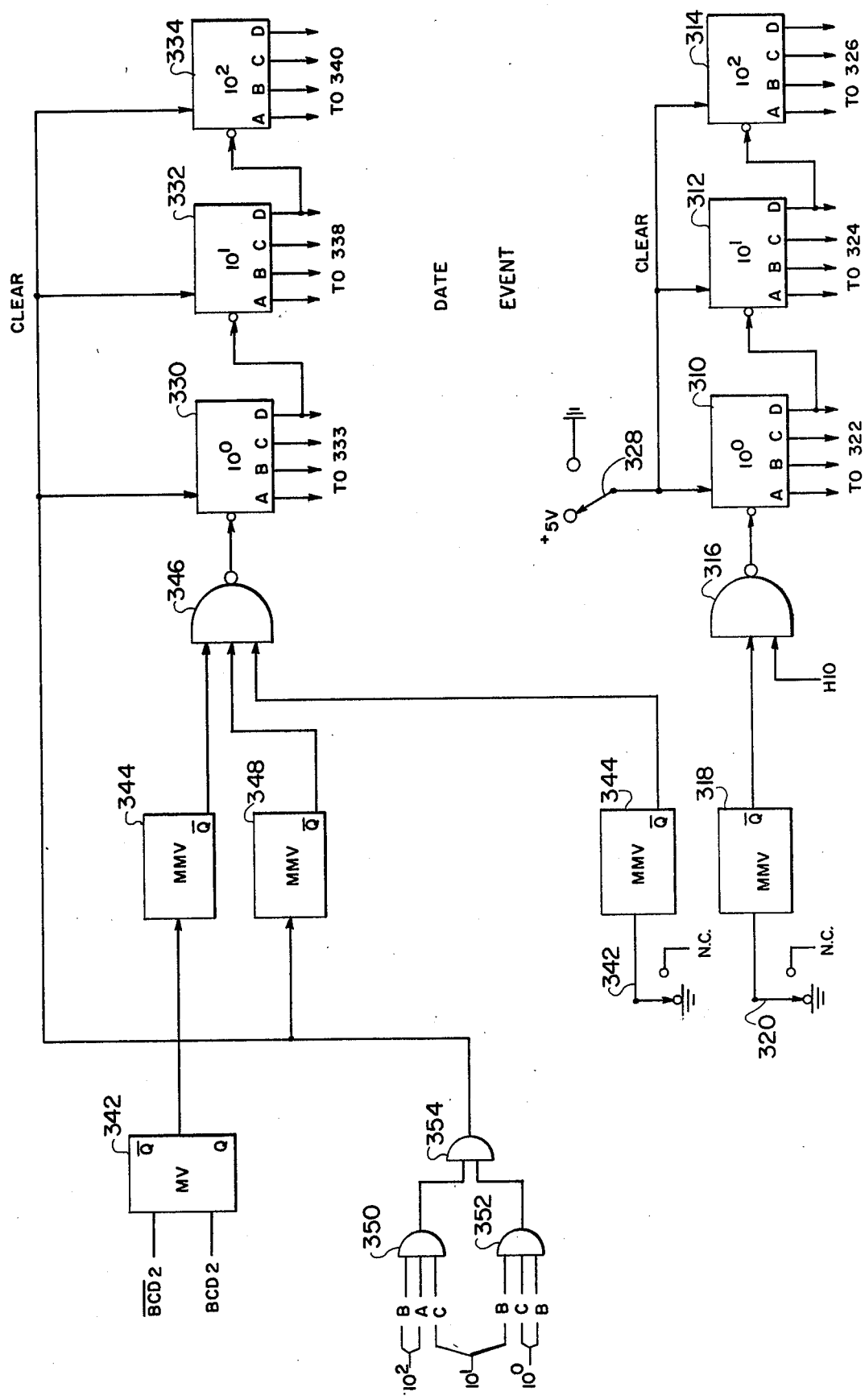

Referring now to FIGS. 4 and 5, there is provided mechanically linked five pole, three position function switch 300-301 that enables the operator to select either time, event or time and date for recordation at the output of operational amplifier 250. Time, four or six digit, as hereinabove described, is recorded by coupling shift register 88 and operational amplifier 250 to shift register 86. A second position of function switch 300-301 is used to generate a three digit event code (1-999) that is incremented by one in each successive code sequence by coupling shift register 326, an SN 74165 type, to operational amplifier 250 and shift register 88.

Referring now to FIG. 5, the event code portion of the instrument comprises three SN 7490 counters 310, 312, 314 in a three decade arrangement that is incremented by one count by the digit enable pulse from NAND gate 50 each time start code switch 100 is pressed. This H10 pulse is applied to NAND gate 316 whose output is applied to the count input of decade counter 310. The next digit enable pulse $\overline{H10}$ from NAND gate 42 causes event counters 310, 312 and 314 to parallel load and transfer their respective counts at terminals A, B, C, D to shift registers 322, 324 and 326 respectively, SN 74165 type, with the event count. The remaining four bits in each register 322, 324 and 326 are loaded with zero spaces as in time registers 80 through 86. The registers are shifted serially after decade counter 202 is enabled, the hundreds digit out first and the units digit out last. Ones enter behind the units data bits and reset NAND gate 90 to terminate the sequence. The serial data clocked from register 326 enters operational amplifier 250 and is converted from data zeros to minus voltages, separating the data bits from spaces as described hereinabove to the time portion. The format of the event code is the same as for the time code, viz, groups of four data bits in a 1, 2, 4, 8 sequence separated by four spaces. The event code is thus a 28 bit sequence - 12 data bits plus 16 zero spaces. Also provided in the event portion of the instrument is for the initial setting of the event count by manual setting of switch 320 which is coupled to NAND gate 316 through one shot multivibrator 318, an SN 74123 type, and the resetting of event counters 310, 312, 314 to zero by switch 328.

The third position of function switch 300-301 is the day and time setting wherein the output of shift register 86 is arranged to follow the recordation of the Julian calender date stored in shift registers 336, 338 and 340. The date is a three digit number and adds 28 bits to the time code sequence. The date code generator, also illustrated in FIGS. 4 and 5, is similar to the event generator. A three decade BCD counter comprising three SN 7490 counters 330, 332 and 334 is initially set by the operator to the correct Julian day by the manual depression of switch 342. Switch 342 causes monostable multivibrator 344 to produce 10 msec output pulses to NAND gate 346 which advances the count in counters 330, 332, 334 to the desired number. Counters 330, 332, 334 are then automatically incremented by one when the time goes from 23:59 to 00:00 as follows: BCD 2 from NAND gate 18 is applied to one input of multivibrator 342 and $\overline{BCD}$ 2 from clock 10 applied as the second input to the multivibrator. Thus when BCD 2 goes from a logical high to a logical low at the instant of 0000, monostable multivibrator 344, coupled to the output of multivibrator 342, is caused to provide a 10 msec pulse to NAND gate 346 coupled thereto for advancing counter 330 coupled thereto by one count. As with the event portion, the count in counters 330, 332 and 334 is parallel loaded and transferred to date shift registers 336, 338 and 340 on digit enable pulse $\overline{H10}$. The three digit date code is then serially shifted ahead of either the four or six digit time code, the hundreds digit shifted out first and the units digit out last. After day 365, counters 330, 332, and 334 are automatically reset to zero and then set to a count of one, 10 msec later. This is accomplished by applying the A and B outputs of the hundreds counter 334 and the C output of tens counter 332 to AND gate 350, and the B output of tens counter 332 and the B and C outputs of units counter 330 to AND gate 352. AND gate 354, coupled to receive the outputs of AND gates 350 and 352 provides its output to the clear inputs of day counters 330, 332 and 334 as well as to monostable multivibrator 348, type SN 74123. Thus, when day counters record day 366, the following outputs are provided:

| Counter 334 | Counter 332 | Counter 330 |
|---|---|---|
| D C B A | D C B A | D C B A |

| Counter 334 | Counter 332 | Counter 330 |
|---|---|---|
| 0 0 1 1 | 0 1 1 0 | 0 1 1 0 |

This causes AND gates 350 and 352 to provide logical highs to AND gate 354, whose logical high clears counters 330, 332 and 334 (causing AND gates 350 and 352 to provide logic low outputs) as well as causing monostable multivibrator 348 to cause a 10 msec pulse to NAND gate 346 which thereupon advances counter 330 coupled thereto to record day number one.

The description hereinabove was given for examples where a single frame of either time, time and date, or event code is generated. If start code switch 100 is left in the on position to hold one input of NAND gate 102 high, continuously repeating code frames are generated. If the function switch 300 is in the event position, the event code in each successive frame will be incremented by one. If time codes are generated, the time will be advanced automatically in synchronism with the digital clock. The date code will be advanced one day in the first code frame after the digital clock passes the twenty-four hour mark. Time, date, and event number are continuously presented by time multiplexed gas discharge display tubes such as 30.

The serial codes generated by the instrument described herein are written on paper or tape recordings in a binary coded decimal (BCD) format that is easier for the average medical technician to quickly interpret than any of the published time code formats. A one bit in the code is indicated by a positive voltage level, a zero bit by a minus voltage, and each bit is separated from adjacent bits by short spaces that are at zero voltage. Each group of four data bits representing one digit is separated by four spaces at zero voltage. The four data bits for each digit are generated in a 1, 2, 4, 8 BCD sequence. A four-digit time frame (hours, minutes) is 36 bits long (16 data bits plus 20 space bits), a six-digit time frame (hours, minutes, seconds) is 52 bits long (24 data bits plus 28 space bits), and three-digit Julian calendar day adds 28 bits to either the 4 or 6 digit time frame. Three-digit event codes, consecutively numbered (1 through 999), are generated apart from the time, or time and data sequence, and are 28 bits long (12 data plus 16 space bits). The bit rate can be adjusted to either 1, 2, or 5 bits per second.

Thus, it can be seen that there has been provided a time code generator that will generate upon command any one of three serial code sequences representing either (1) time of day, either four or six digits (i.e., hours, minutes, seconds), (2) time and date, or (3) event number. Any one of three serial codes can be selected, and either a single sequence or continuously repeating code sequence can be generated. The instrument is intended for use in any biomedical or other data acquisition system in which data from multiple sensors, e.g., strain gauge manometers, EKG, and EEG electrodes, blood oximeters and densitometers, are recorded on magnetic tape or oscillographic paper. The time, date, and event codes generated are recorded simultaneously and in parallel with physiologic or other data to permanently identify or index the recorded data. The serial codes are in a binary coded decimal formal resembling, but not identical, to NAFEC of FAA tome code formats. The time, date, and event or any other data identification digits are easier to interpret visually then recognized time code formats. The three-digit event codes, consecutively numbered 1 through 999 in successive frames is particularly valuable for indexing experimental maneuvers or deliberate changes in experimental variables. The event code can be generated apart from the time or time and date codes. A press of a single lever switch will initiate either time, time and date, or event codes, depending upon the position of the function switch.

The unique system used to strobe the BCD output lines of commercially available integrated circuit digital clocks permits either single frames or continuously repeating code sequences to be generated. No monostable or other timing circuits that require adjustment are necessary. All of the strobe timing and sequencing operations are synchronized by the multiplex timer. The multiplex frequency is not critical, and can be deliberately changed, or may drift due to component aging, over a range of less than one pulse per second to greater than $10^4$ pulses per second without adversely affecting circuit operation. The only timing capacitor is in the multiplex timer. The only potentiometers in the instrument adjust the amplitudes of the signal output to the recorders.

Manual tape search is simplified by the presence of identification codes that can be easily read with an oscilloscope during tape playback. The tri-level format of the code simplifies not only visual interpretation of the codes but also the design of a code reading instrument as well. Half-wave rectification of the playback signal will convert it to a form that can be serially read into a shift register. Full-wave rectification of the playback signal will generate the shift register clock.

The instrument can be used as a real time clock in a digital computer based acquisition system. TTL logic BCD format, and clock inhibit signal for interrupt, simplify the logic design for a suitable interface. Obviously many modifications and variations of the present invention are possible in the light of the above teachings. If seven seqment outputs are available in lieu of BCD, a seven segment to BCD converter would have to be added. It is therefore understood that within the scope of the appended claims, the invention may be practiced otherwise than as specifically described.

What is claimed as new and desired to be secured by Letters Patent of the United States is:

1. A code generator for providing code sequences representing diverse information for recordation on a storage medium along with data acquisition, comprising:
    a digital clock for providing both multiplexed binary coded decimal and enabling signals;
    parallel load serial out shift registers arranged in series, each shift register coupled to said binary coded decimal signals and repective enabling signals for receiving said binary coded decimal and said enabling signals for recordation on said storage medium; and
    switch means adapted to be depressed whenever a code sequence is to be recorded.

2. A code generator as recited in claim 1 further comprising means for combining said binary coded decimal and said enabling signals for visual display, wherein said diverse information comprises time, date and time and event, said data acquisition comprises biomedical data, said combining means for visual display comprises binary coded decimal to seven segment decoders coupled to receive both said binary coded decimal and said enabling signals, said display comprising a gas discharge display.

3. A code generator as recited in claim 2 further including a first decade counter clock coupled to said shift registers for clocking said shift registers.

4. A code generator as recited in claim 3 further comprising:
   logic means coupled to said switch means for enabling said shift registers to receive said binary coded decimal signals and for enabling said clock to provide said clock signals.

5. A code generator as recited in claim 4 wherein said logic means comprises:
   a first NAND gate coupled to receive a logical high from said depressed switch means;
   first multivibrator means coupled to receive said first NAND gate output;
   a second decade counter coupled to said first multivibrator means for ensuring that said first multivibrator output is logical high for the length of time of one series of enabling signals;
   second multivibrator means coupled to receive the output of said first multivibrator means; and
   third multivibrator means coupled to receive the output of said second multivibrator means.

6. A code generator as recited in claim 5, wherein:
   said third multivibrator means enables said first decade counter; and
   said shift register enabling means comprises a plurality of NAND gates coupled to respective enabling signals and the output of said second multivibrator means.

7. A code generator as recited in claim 6 further comprising:
   an operational amplifier coupled to the last shift register in said series of shift register for providing digital signals for recordation, said recordation signals being arranged in a visually interpretable manner with data ones represented as positive voltage pulses, data zeros represented by negative voltage pulses and spaces at zero volts.

8. A code generator as recited in claim 7 further including an enabling NAND gate coupled to the input of said operational amplifier, a three bit binary counter and said first decade counter block being provided as the input to said enabling NAND gate.

9. A code generator as recited in claim 8 further including means for inhibiting said shift registers upon completion of said code sequence recordation, comprising a serial-in shift register coupled to the last of said series of shift registers, and a NAND gate coupled to said shift register, said NAND gate output coupled to the input of said third multivibrator means.

10. A code generator as recited in claim 9 further comprising switch means for selecting either time, event or date and time for recordation on said storage medium.

11. A code generator as recited in claim 10 further comprising an event code portion comprising a three decade arrangement for storing and transferring event numbers to said serial shift registers, and means for incrementing and clearing said stored event numbers.

12. A code generator as recited in claim 11 further comprising a date code portion comprising a three decade arrangement for storing and transferring Julian dates to said serial shift registers, and means for incrementing and clearing said stored Julian date.

* * * * *